(12) United States Patent
Tsai et al.

(10) Patent No.: US 10,804,884 B1
(45) Date of Patent: Oct. 13, 2020

(54) VOLTAGE TOLERANT LEVEL SHIFTER

(71) Applicant: M31 TECHNOLOGY CORPORATION, Hsinchu County (TW)

(72) Inventors: Ming-Yen Tsai, Hsinchu County (TW); Chun-Hsiang Lai, Taichung (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 16/749,366

(22) Filed: Jan. 22, 2020

(51) Int. Cl.
| H03L 5/00 | (2006.01) |
| H03K 3/037 | (2006.01) |
| H03K 19/003 | (2006.01) |
| H03K 19/0185 | (2006.01) |

(52) U.S. Cl.
CPC ..... *H03K 3/0375* (2013.01); *H03K 19/00315* (2013.01); *H03K 19/018528* (2013.01)

(58) Field of Classification Search
CPC ........... H03K 3/356113; H03K 3/0375; H03K 19/00315; H03K 19/018528; H03K 19/018521; H03K 19/018585
See application file for complete search history.

(56) References Cited

U.S. PATENT DOCUMENTS

| 7,046,036 B2 | 5/2006 | Chen et al. |
| 8,531,227 B2 | 9/2013 | Kumar et al. |
| 9,553,584 B2 * | 1/2017 | Aipperspach ......... G06F 30/327 |
| 9,748,957 B2 * | 8/2017 | Kumar ............... H03K 19/0185 |

\* cited by examiner

*Primary Examiner* — Long Nguyen

(74) *Attorney, Agent, or Firm* — WPAT, P.C., Intellectual Property Attorneys; Anthony King

(57) ABSTRACT

A level shifter includes a latch circuit, an input stage, a driver stage and a control circuit. The latch circuit is configured to generate an output signal according to a signal level at a first drive node and a signal level at a second drive node. The input stage is configured to receive an input signal to adjust a signal level at a connection node. The driver stage is configured to drive the first drive node by coupling the connection node to the first drive node according to a set of control signals. The control circuit is coupled to the input stage and the driver stage. The control circuit is configured to control the driver stage to couple the connection node to the first drive node by adjusting a signal level of each control signal in the set of control signals during a level transition of the input signal.

20 Claims, 9 Drawing Sheets

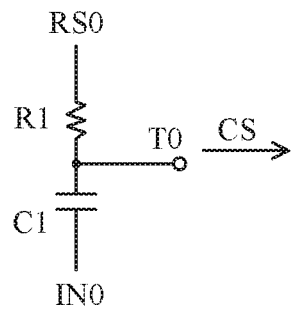
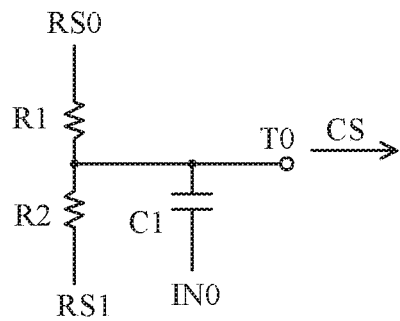
FIG. 4A
FIG. 4B
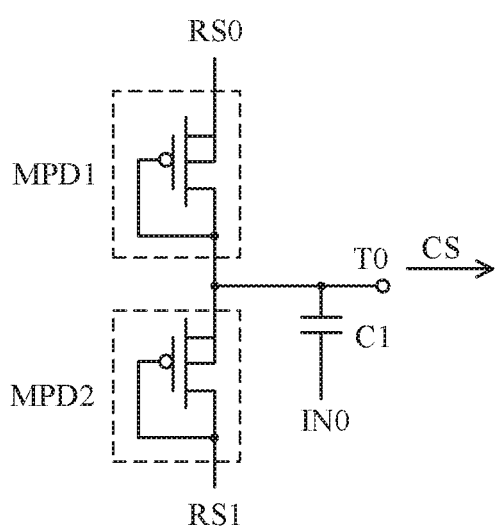
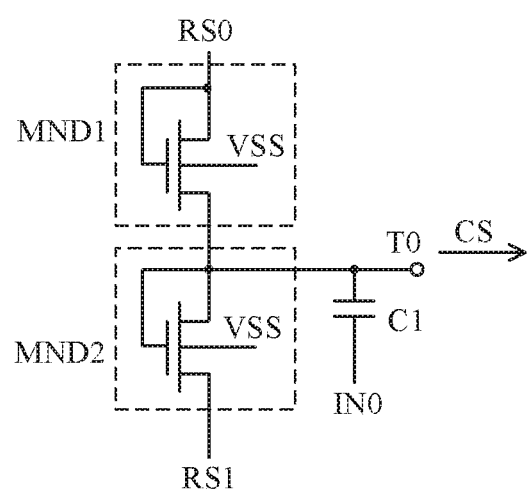
FIG. 4C
FIG. 4D

US 10,804,884 B1

VOLTAGE TOLERANT LEVEL SHIFTER

BACKGROUND

The present disclosure relates to voltage level shifting and, more particularly, to a voltage tolerant level shifter capable of generating complementary output signals.

A system-on-chip (SoC) design allows different circuit blocks, including analog and digital circuits, to be integrated onto a single chip. As the circuit blocks may operate at different voltage levels in the same chip, a level shifter capable of converting a voltage signal from one voltage level to another is commonly used for interfacing the circuit blocks. A multi-chip system, where different chips operate at different voltage domains, can also utilize a level shifter to enable communication between the different chips. For example, different chips in a mobile phone device, such as a radio-frequency (RF) chip, a baseband processor, a power management chip and a power amplifier, can interface with each other with the use of a level shifter.

SUMMARY

The described embodiments provide a level shifter, which includes a control circuit such as one or more resistive-capacitive networks to reduce a voltage stress across a circuit element of the level shifter, and a level shifting scheme.

Some embodiments described herein may include a level shifter. The level shifter includes a latch circuit, an input stage, a driver stage and a control circuit. The latch circuit is configured to generate an output signal according to a signal level at a first drive node and a signal level at a second drive node. The input stage is configured to receive an input signal to adjust a signal level at a connection node. The driver stage is configured to drive the first drive node by coupling the connection node to the first drive node according to a set of control signals. The control circuit is coupled to the input stage and the driver stage. The control circuit is configured to control the driver stage to couple the connection node to the first drive node by adjusting a signal level of each control signal in the set of control signals during a level transition of the input signal.

Some embodiments described herein may include a level shifter. The level shifter includes an input stage, a driver stage and a latch circuit. The input stage is configured to receive an input signal to adjust a signal level at a connection node. The driver stage, coupled to the connection node, is configured to couple the connection node to a first drive node to drive the first drive node. The latch circuit is coupled between a supply voltage and a reference voltage. The latch circuit includes a first inverter, a second inverter and a first transistor. The first inverter and the second inverter are cross-coupled between the first drive node and a second drive node. The first inverter is coupled between the supply voltage and an intermediate node, and is configured to generate an output signal according to a signal level at the first drive node and a signal level at the second drive node. The first transistor is coupled between the intermediate node and the reference voltage. A control terminal of the first transistor is coupled to another connection node located on a circuit path between the first drive node and the connection node.

Some embodiments described herein may include a level shifter. The level shifter includes a first inverter, a second inverter, a first input circuit, a second input circuit, a first driver circuit, a second driver circuit, a first resistive-capacitive (RC) network and a second RC network. The first inverter and the second inverter are cross-coupled between a first drive node and a second drive node. The first inverter is configured to generate a first output signal. The second inverter is configured to generate a second output signal complementary to the first output signal. The first input circuit is configured to receive an input signal to adjust a signal level at a first connection node. The second input circuit is configured to receive an inverted signal of the input signal to adjust a signal level at a second connection node. The first driver circuit is configured to drive the first drive node by coupling the first connection node to the first drive node according to a first control signal. The second driver circuit is configured to drive the second drive node by coupling the second connection node to the second drive node according to a second control signal. The first RC network includes a first output terminal, a first resistive circuit and a first capacitive circuit. The first output terminal is arranged to output the first control signal. The first resistive circuit is coupled between the first output terminal and a reference signal. The first capacitive circuit is coupled between the first output terminal and one of the input signal and the inverted signal. The second RC network includes a second output terminal, a second resistive circuit and a second capacitive circuit. The second output terminal is arranged to output the second control signal. The second resistive circuit is coupled between the second output terminal and the reference signal. The second capacitive circuit is coupled between the second output terminal and the other of the input signal and the inverted signal.

With the use of the proposed level shifting scheme, a level shifter can extend reliability of circuit elements therewithin by turning on a circuit path in response to a level transition of an input signal. Additionally or alternatively, the level shifter can alleviate fighting problems by actively cutting off a discharging path according to a signal level at a connection node, wherein the signal level at the connection node changes rapidly in response to a level transition of the input signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A to FIG. 4F illustrate some implementations of the RC network shown in FIG. 3.

DETAILED DESCRIPTION

Figure 1:
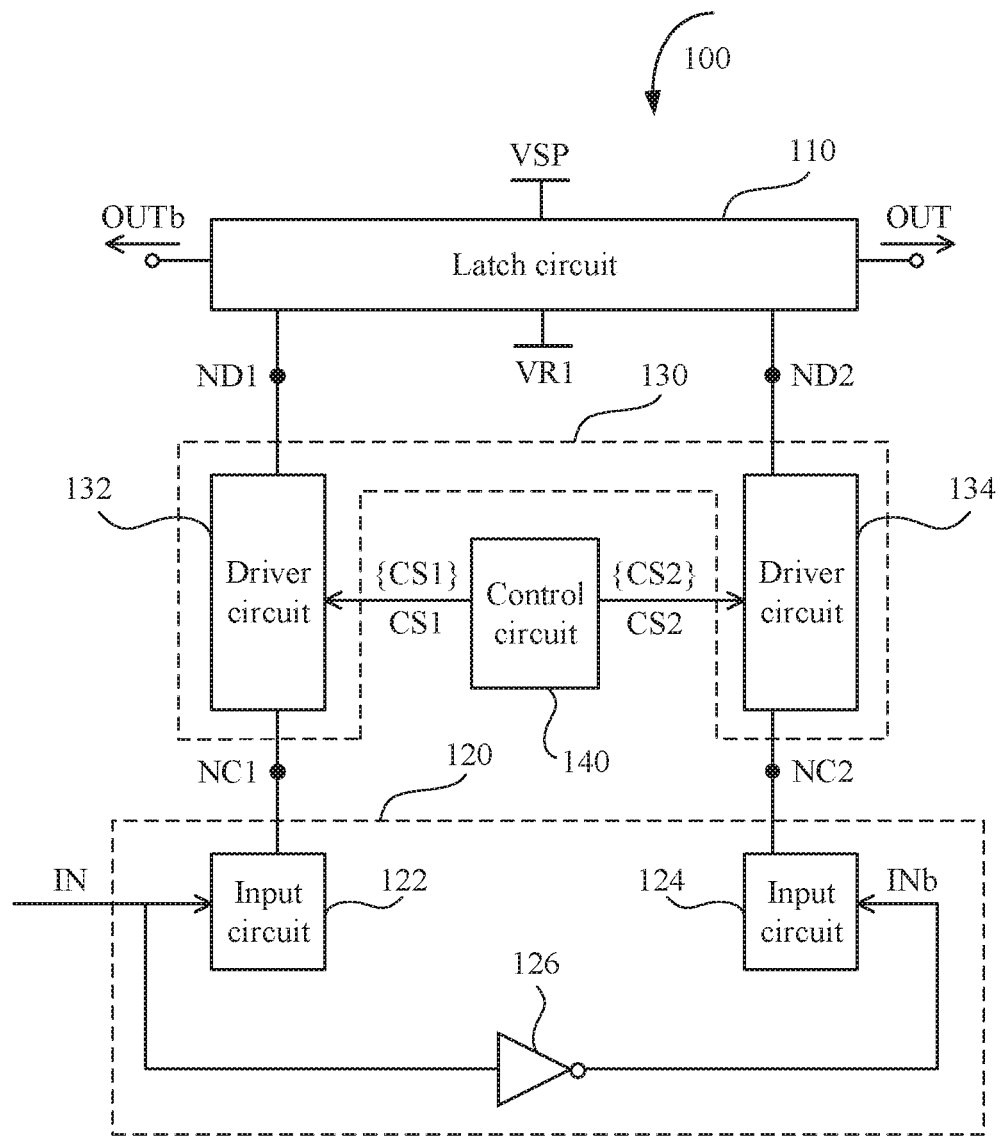
FIG. 1 is a block diagram illustrating an exemplary level shifter in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, parameter values in the description that follows may vary depending on a given technology node such as an advanced CMOS technology node, an advanced FinFET technology node or other semiconductor technology nodes. As another example, parameter values for a given technology node may vary depending on a given application or operating scenario. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

To meet different voltage requirements, a level shifter may work in a high power output mode where an input signal is converted to an output signal having a higher voltage level. In the high power output mode, some circuit elements in the level shifter, however, often suffer from voltage stresses. For example, because it takes some time to reduce a source voltage of an n-channel transistor in the level shifter before the n-channel transistor is turned on, a drain-to-source voltage of the n-channel transistor will exceed a supply voltage when a high voltage level is applied to a drain of the n-channel transistor, thus causing reliability problems. Another concern is a low operational speed of the level shifter that results from complementary output signals which fight each other.

The present disclosure describes exemplary level shifters, which can use signals occurring in the level shifters to thereby reduce voltage stresses applied to circuit elements therewithin. In some embodiments, an input signal of a level shifter, e.g. an input voltage to be level-shifted, can be used for turning on a circuit path before a voltage difference between two ends of the circuit path exceeds a threshold. Additionally, or alternatively, the exemplary level shifters can use signals occurring in the level shifters to increase an operational speed thereof even if the exemplary level shifters includes a complementary structure where a pull-down transistor may fight a pull-up transistor. Further description is provided below.

FIG. 1 is a block diagram illustrating an exemplary level shifter in accordance with some embodiments of the present disclosure. The level shifter 100 can be implemented as at least a portion of a voltage level shifting circuit capable of providing unidirectional or bidirectional level-shifting. In the present embodiment, the level shifter 100 can be implemented as a differential level shifter used for providing a pair of output signals OUT and OUTb in response to an input signal IN. The output signals OUT and OUTb are complementary to each other. The output signal OUT/OUTb can serve as a supply voltage for a next circuit stage coupled to the level shifter 100. It is worth noting that the proposed level shifting scheme can be employed in a level shifter which provides a single-ended output signal without departing from the scope of the present disclosure.

In some embodiments, the output signal OUT/OUTb may have a signal range different from a signal range of the input signal IN. By way of example but not limitation, an upper boundary level of the signal range of the output signal OUT may be different from that of the signal range of the input signal IN. As another example, a lower boundary level of the signal range of the output signal OUT may be different from that of the signal range of the input signal IN. As still another example, a signal swing of the output signal OUT may be different from that of the input signal IN.

The level shifter 100 includes, but not limited to, a latch circuit 110, an input stage 120, a driver stage 130 and a control circuit 140. The latch circuit 110 is configured to generate the output signals OUT and OUTb according to respective signal levels at drive nodes ND1 and ND2. In the present embodiment, the latch circuit 110 is coupled between a supply voltage VSP and a reference voltage VR1. A signal range of the output signal OUT can be determined according to the supply voltage VSP and the reference voltage VR1. By way of example but not limitation, an upper boundary level of the signal range of the output signal OUT may be equal to, or substantially equal to, a voltage level of the supply voltage VSP. As another example, a lower boundary level of the signal range of the output signal OUT may be equal to, or substantially equal to, a voltage level of the reference voltage VR1. It is worth noting that at least one of the supply voltage VSP and the reference voltage VR1 may vary in response to a mode of operation of the level shifter 100. The signal range of the output signal OUT may change accordingly.

The input stage 120 is configured to adjust respective signal levels at connection nodes NC1 and NC2 in response to the input signal IN. In the present embodiment, the input stage 120 may include an input circuit 122 and an input circuit 124. The input circuit 122 is configured to receive the input signal IN to adjust the signal level at the connection node NC1. The input circuit 124 is configured to receive an input signal INb, e.g. an inverted signal of the input signal IN, to adjust the signal level at the connection node NC2. By way of example but not limitation, the input stage 120 may further include an inverter 126 coupled between the input circuits 122 and 124. The inverter 126 can be configured to invert the input signal IN to generate the input signal INb.

The driver stage 130 is configured to couple the connection node NC1 to the drive node ND1 according to a set of control signals {CS1}, thereby driving the drive node ND1. Also, driver stage 130 is configured to couple the connection node NC2 to the drive node ND2 according to a set of control signals {CS2}, thereby driving the drive node ND2. In the present embodiment, the driver stage 130 may include a driver circuit 132 and a driver circuit 134. The driver circuit 132 is configured to couple the connection node NC1 to the drive node ND1 according to the set of control signals {CS1}. When coupling the connection node NC1 to the drive node ND1, the driver circuit 132 can adjust the signal level at the drive node ND1 according to the signal level at the connection node NC1. The driver circuit 134 is configured to couple the connection node NC2 to the drive node ND2 according to the set of control signals {CS2}, thereby adjusting the signal level at the drive node ND2 according to the signal level at the connection node NC1.

The control circuit 140, coupled to the input stage 110 and the driver stage 120, is configured to provide the sets of control signals {CS1} and {CS2}, thereby controlling operation of the driver stage 130. In the present embodiment, the control circuit 140 can be configured to adjust a signal level of each control signal in the set of control signals {CS1} during a level transition of the input signal IN or the input signal INb, thereby controlling the driver circuit 132 to couple the connection node NC1 to the drive node ND1. For example, the control circuit 140 may adjust a signal level of a control signal CS1 in the set of control signals {CS1} in response to an increase or a decrease in a signal level of the input signal IN, thereby shortening the time for turning on a circuit path between the drive node ND1 and the connection node NC1. In some embodiments, the connection node NC1 can be coupled to the drive node ND1 before a difference between the respective signal levels at the drive node ND1 and the connection node NC1 exceeds a threshold, e.g. a signal swing of the output signal OUT/OUTb. In some embodiments, the control circuit 140 can shorten the time during which the voltage difference between the drive node ND1 and the connection node NC1 exceeds the threshold. After the level transition of the input signal IN, the control circuit 140 can be configured to maintain the control signal CS1 at a reference signal level, e.g. a boundary level of a signal range of the output signal OUT/OUTb.

Similarly, the control circuit 140 can be configured to adjust a signal level of each control signal in the set of control signals {CS2} during a level transition of the input signal INb or the input signal INb, thereby controlling the driver circuit 134 to couple the connection node NC2 to the drive node ND2. For example, the control circuit 140 may adjust a signal level of a control signal CS2 in the set of control signals {CS2} in response to an increase or a decrease in a signal level of the input signal INb, thereby shortening the time for turning on a circuit path between the drive node ND2 and the connection node NC2. In some embodiments, the connection node NC2 can be coupled to the drive node ND2 before a difference between the respective signal levels at the drive node ND2 and the connection node NC2 exceeds a threshold, e.g. a signal swing of the output signal OUT/OUTb. In some embodiments, the control circuit 140 can shorten the time during which the voltage difference between the drive node ND2 and the connection node NC2 exceeds the threshold. After the level transition of the input signal INb, the control circuit 140 can be configured to maintain the control signal CS2 at a reference signal level, e.g. a boundary level of a signal range of the output signal OUT/OUTb.

In operation, during a period of time when the input signal IN transitions from one of a logic low level and a logic high level to the other, the input circuit 122 may adjust the signal level at the connection node NC1 according to the input signal IN. The control circuit 140 may adjust a signal level of each control signal in the set of control signals {CS1} in response to such level transition of the input signal IN, thereby shortening the time taken for the drive circuit 132 to couple the connection node NC2 to the drive node ND2. For example, the control circuit 140 can turn on a circuit path between the connection node NC2 and the drive node ND2 before a voltage difference between the connection node NC2 and the drive node ND2 exceeds a signal swing of the output signal OUT. As another example, the control circuit 140 can shorten the time during which the voltage difference between the connection node NC2 and the drive node ND2 exceeds the signal swing of the output signal OUT. As a result, the level shifter 100 can reduce a voltage stress applied across the driver circuit 132, thus enhancing reliability of one or more circuit elements in the driver circuit 132.

When the connection node NC1 is coupled to the drive node ND1, the latch circuit 110 may adjust a signal level of the output signal OUT according to the signal level at the drive node ND1. For example, a level transition may occur in the output signal OUT in response to the level transition of the input signal IN. In addition, after the input signal IN transitions from one of a logic low level and a logic high level to the other, each control signal in the set of control signals {CS1} may be kept at a corresponding reference signal level.

Similarly, during a period of time when the input signal INb transitions from one of a logic low level and a logic high level to the other, the control circuit 140 may adjust a signal level of each control signal in the set of control signals {CS2} in response to such level transition of the input signal IN, thereby reducing a voltage stress applied across the connection node NC2 and the drive node ND2, thus enhancing reliability of one or more circuit elements in the driver circuit 134. After the input signal INb transitions from one of a logic low level and a logic high level to the other, each control signal in the set of control signals {CS2} may be kept at a corresponding reference signal level.

To facilitate understanding of the present disclosure, some embodiments are given in the following for further description of the proposed level shifting scheme. Those skilled in the art should appreciate that other embodiments employing the structure of the level shifter 100 shown in FIG. 1 are also within the contemplated scope of the present disclosure.

Figure 2:
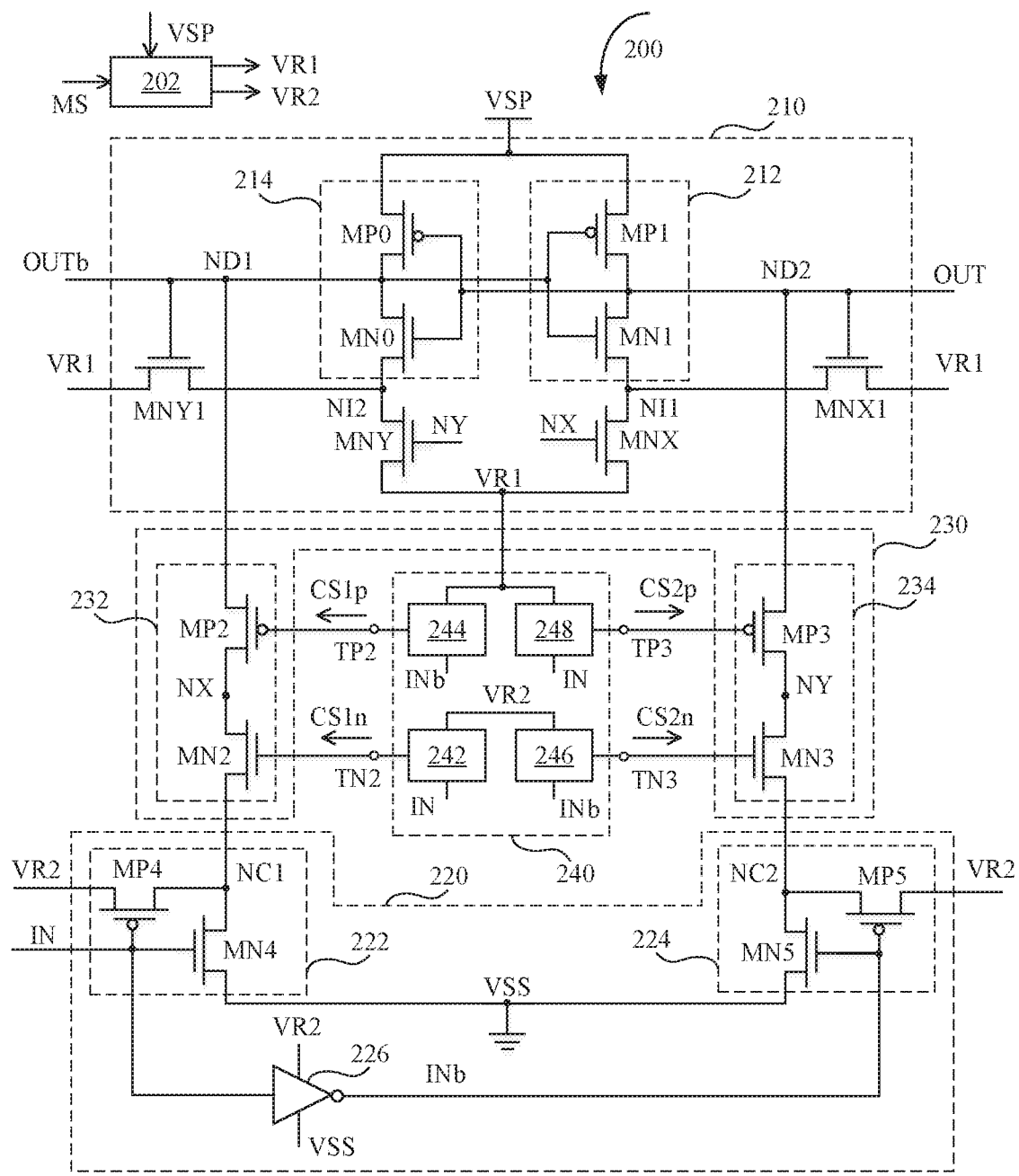
FIG. 2 illustrates an implementation of the level shifter shown in FIG. 1 in accordance with some embodiments of the present disclosure.

FIG. 2 illustrates an implementation of the level shifter 100 shown in FIG. 1 in accordance with some embodiments of the present disclosure. The level shifter 200 may include a latch circuit 210, an input stage 220, a driver stage 230 and a control circuit 240, which can represent embodiments of the latch circuit 110, the input stage 120, the driver stage 130 and the control circuit 140 shown in FIG. 1, respectively.

The latch circuit 210 may include a plurality of inverters 212 and 214, which are cross-coupled between the drive nodes ND1 and ND2. The inverter 212, coupled between the supply voltage VSP and an intermediate node NI1, is configured to generate the output signal OUT according to the signal level at the drive node ND1. The inverter 212 can output the output signal OUT through the drive node ND2. The inverter 214, coupled between the supply voltage VSP and an intermediate node NI2, is configured to generate the output signal OUTb according to the signal level at the drive node ND2. The inverter 214 can output the output signal OUTb through the drive node ND1. For example, the inverter 212 can be implemented using two transistors MP1 and MN1 coupled in series, wherein respective control terminals of the transistors MP1 and MN1 are coupled to the drive node ND1. The inverter 214 can be implemented using two transistors MP0 and MN0 coupled in series, wherein respective control terminals of the transistors MP0 and MN0 are coupled to the drive node ND2.

In the present embodiment, the latch circuit 210 may further include a plurality of transistors MNX, MNY, MNX1 and MNY1. The transistor MNX is coupled between the intermediate node NI1 and the reference voltage VR1. It is worth noting that a control terminal of the transistor MNX is coupled to a connection node NX, which is located on a circuit path between the drive node ND1 and the connection node NC1. As a result, when the signal level at the connection node NC1 is pulled down, a signal level at the connection node NX falls faster than the signal level at the drive node ND1, thus allowing the transistor MNX to be turned off earlier than the transistor MN1. Similarly, the transistor MNY, coupled between the intermediate node NI2 and the reference voltage VR1, has a control terminal coupled to a connection node NY which is located on a circuit path between the drive node ND2 and the connection node NC2. When the signal level at the connection node NC2 is pulled down, a signal level at the connection node NY falls faster than the signal level at the drive node ND2, thus allowing the transistor MNY to be turned off earlier than the transistor MN0. With the use of at least one of the transistors MNX and MNY, the level shifter 200 can alleviate fighting problems. Associated description will be provided later.

The transistor MNX1 is coupled between the reference voltage VR1 and the intermediate node NI1, wherein a control terminal of the transistor MNX1 is coupled to the drive node ND2. The transistor MNX1 is configured to set a signal level at the intermediate node NI1 to a voltage level of the reference voltage VR1. The transistor MNY1 is coupled between the reference voltage VR1 and the intermediate node NI2, wherein a control terminal of the transistor MNY1 is coupled to the drive node ND1. The transistor MNY1 is configured to set a signal level at the intermediate node NI2 to the voltage level of the reference voltage VR1. In the present embodiment, each of the transistors MP0 and MP1 may be implemented using a p-channel transistor. Each of the transistors MN0, MN1, MNX, MNY, MNX1 and MNY1 may be implemented using an n-channel transistor.

The input stage 220 may include an input circuit 222, an input circuit 224 and an inverter 226, which can represent embodiments of the input circuit 122, the input circuit 124 and the inverter 126 shown in FIG. 1, respectively. In the present embodiment, the input circuit 222 includes a plurality of transistors MN4 and MP4. The transistor MN4 is coupled between the connection node NC1 and a supply voltage VSS, wherein a control terminal of the transistor MN4 is coupled to the input signal IN. The supply voltage VSS and the supply voltage VSP have different voltage levels. By way of example but not limitation, the supply voltage VSS may be a ground voltage. In addition, the transistor MP4 is coupled between a reference voltage VR2 and the connection node NC1, wherein a control terminal of the transistor MP4 is coupled to the input signal IN. Each of the transistors MN4 and MP4 can be configured to adjust the signal level at the connection node NC1 in response to the input signal IN.

The input circuit 224 includes a plurality of transistors MN5 and MP5. The transistor MN5 is coupled between the connection node NC2 and the supply voltage VSS, wherein a control terminal of the transistor MN5 is coupled to the input signal INb. The transistor MP5 is coupled between the reference voltage VR2 and the connection node NC2, wherein a control terminal of the transistor MP5 is coupled to the input signal INb. Each of the transistors MN5 and MP5 can be configured to adjust the signal level at the connection node NC2 in response to the input signal INb. Additionally, the inverter 226 is coupled between the reference voltage VR2 and the supply voltage VSS.

The driver stage 230 may include a plurality of driver circuits 232 and 234, which can represent embodiments of the driver circuits 132 and 134 shown in FIG. 1, respectively. In the present embodiment, the driver circuit 232 includes a plurality of transistors MN2 and MP2 coupled in series on the circuit path between the drive node ND1 and the connection node NC1. The transistor MN2 is coupled between the connection node NX and the connection node NC1, wherein a control terminal of the transistor MN2 is arranged to receive a control signal CS1n. The transistor MP2 is coupled between the drive node ND1 and the connection node NX, wherein a control terminal of the transistor MP2 is arranged to receive a control signal CS1p. The control signals CS1n and CS1p can be an embodiment of at least a portion of the set of control signals {CS1} shown in FIG. 1.

The driver circuit 234 includes a plurality of transistors MN3 and MP3 coupled in series on the circuit path between the drive node ND2 and the connection node NC2. The transistor MN3 is coupled between the connection node NY and the connection node NC2, wherein a control terminal of the transistor MN3 is arranged to receive a control signal CS2n. The transistor MP3 is coupled between the drive node ND2 and the connection node NY, wherein a control terminal of the transistor MP3 is arranged to receive a control signal CS2p. The control signals CS2n and CS2p can be an embodiment of at least a portion of the set of control signals {CS2} shown in FIG. 1.

The control circuit 240, coupled to the respective control terminals of the transistors MN2, MP2, MN3 and MP3, is configured to adjust respective signal levels of the control signals CS1n, CS1p, CS2n and CS2p to selectively turn on the transistors MN2, MP2, MN3 and MP3. In the present embodiment, when configured to control operation of an n-channel transistor, the control circuit 240 may increase a signal level of a control signal inputted to the n-channel transistor in response to a level transition of the input signal IN, thereby turning on the n-channel transistor. When to control operation of a p-channel transistor, the control circuit 240 may decrease a signal level of a control signal inputted to the p-channel transistor in response to a level transition of the input signal IN, thereby turning on the p-channel transistor.

For example, to turn on the transistor MN2 implemented using an n-channel transistor, the control circuit 240 can be configured to increase the signal level of the control signal CS1n in response to the level transition of the input signal IN, which is inputted to the input circuit 222 coupled to the transistor MN2. To turn on the transistor MP2 implemented using a p-channel transistor, the control circuit 240 can be configured to decrease the signal level of the control signal CS1p in response to the level transition of the input signal IN. As another example, to turn on the transistor MN3 implemented using an n-channel transistor, the control circuit 240 can be configured to increase the signal level of the control signal CS2n in response to the level transition of the input signal INb, which is inputted to the input circuit 224 coupled to the transistor MN3. To turn on the transistor MP3 implemented using a p-channel transistor, the control circuit 240 can be configured to decrease the signal level of the control signal CS2p in response to the level transition of the input signal INb.

In the present embodiment, the control circuit 240 may include a plurality of resistive-capacitive (RC) networks 242-248. The RC networks 242 and 244 are configured to receive input signals inverted with each other, i.e. the input signal IN and the input signal INb, to generate the control signals CS1n and CS1p, respectively. The RC network 242, having an output terminal TN2, is configured to output the control signal CS1n according to the reference voltage VR2 and the input signal IN. The RC network 244, having an output terminal TP2, is configured to output the control signal CS1p according to the reference voltage VR1 and the input signal INb. In some embodiments, with the use of at least one of the RC networks 242 and 244, the driver circuit 232 can couple the connection node NC1 to the drive node ND1 before the difference between the respective signal levels at the drive node ND1 and the connection node NC1 exceeds a threshold such as the signal swing of the output signal OUT. In some embodiments, at least one of the RC networks 242 and 244 can shorten the time during which the difference between the respective signal levels at the drive node ND1 and the connection node NC1 exceeds a threshold such as the signal swing of the output signal OUT.

The RC networks 246 and 248 are configured to receive input signals inverted with each other, i.e. the input signal INb and the input signal IN, to generate the control signals CS2n and CS2p, respectively. The RC network 246, having an output terminal TN3, is configured to output the control signal CS2n according to the reference voltage VR2 and the input signal INb. The RC network 248, having an output terminal TP3, is configured to output the control signal CS2p according to the reference voltage VR1 and the input signal INb. Similarly, with the use of at least one of the RC networks 246 and 248, the driver circuit 234 can couple the connection node NC2 to the drive node ND2 before the difference between the respective signal levels at the drive node ND2 and the connection node NC2 exceeds a threshold such as the signal swing of the output signal OUT. Alternatively, at least one of the RC networks 246 and 248 can shorten the time during which the difference between the respective signal levels at the drive node ND2 and the connection node NC2 exceeds a threshold such as the signal swing of the output signal OUT.

Figure 3:
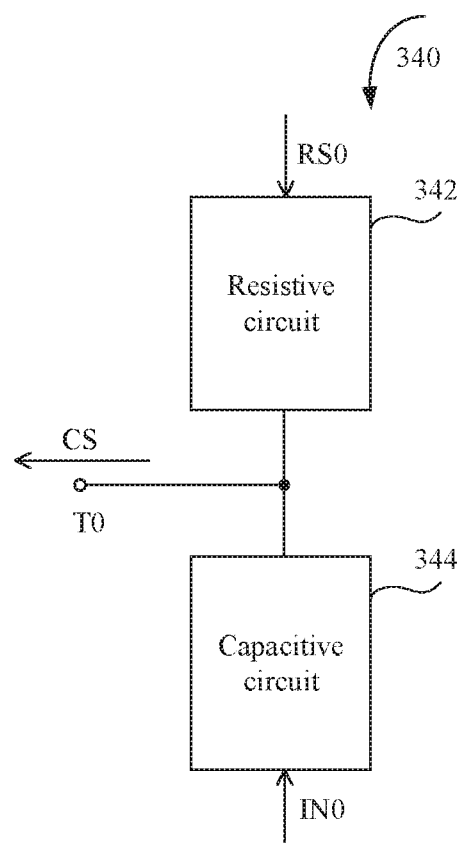
FIG. 3 is a block diagram illustrating an exemplary RC network used to implement at least one of the RC networks shown in FIG. 2 in accordance with some embodiments of the present disclosure.

FIG. 3 is a block diagram illustrating an exemplary RC network 340 used to implement at least one of the RC networks 242-248 shown in FIG. 2 in accordance with some embodiments of the present disclosure. The RC network 340 may include an output terminal T0, a resistive circuit 342 and a capacitive circuit 344. The output terminal T0 is arranged to output a control signal CS, e.g. one of the control signals CS1n, CS1p, CS2n and CS2p shown in FIG. 2. The resistive circuit 342 is coupled between the output terminal T0 and a reference signal RS0. The capacitive circuit 344 is coupled between the output terminal T0 and an input signal INO. The input signal INO can be implemented using one of the input signals IN and INb shown in FIG. 2.

In the present embodiment, the resistive circuit 342 is configured to apply a reference signal level to the output terminal T0 according to the reference signal RS0. The capacitive circuit 344 is configured to receive the input signal INO, and adjust a signal level of the control signal CS by adjusting a signal level at the output terminal T0 in response to a level transition of the input signal INO. Referring to FIG. 3 and also to FIG. 2, in some embodiments where the RC network 242 is implemented using the RC network 340, the reference signal level applied by the resistive circuit 342 may be equal to a voltage level of the reference voltage VR2. Also, the capacitive circuit 344 may adjust the signal level of the control signal CS in response to a level transition of the input signal IN, wherein the control signal CS serve as the control signal CS1n. In some embodiments where the RC network 244 is implemented using the RC network 340, the reference signal level applied by the resistive circuit 342 may be equal to a voltage level of the reference voltage VR1. The capacitive circuit 344 may adjust the signal level of the control signal CS in response to a level transition of the input signal INb, wherein the control signal CS serve as the control signal CS1p.

Similarly, in some embodiments where the RC network 246 is implemented using the RC network 340, the reference signal level applied by the resistive circuit 342 may be equal to the voltage level of the reference voltage VR2. The capacitive circuit 344 may adjust the signal level of the control signal CS in response to a level transition of the input signal IN, wherein the control signal CS serve as the control signal CS2n. In some embodiments where the RC network 248 is implemented using the RC network 340, the reference signal level applied by the resistive circuit 342 may be equal to the voltage level of the reference voltage VR1. The capacitive circuit 344 may adjust the signal level of the control signal CS in response to a level transition of the input signal INb, wherein the control signal CS serve as the control signal CS2p.

Figure 4E:
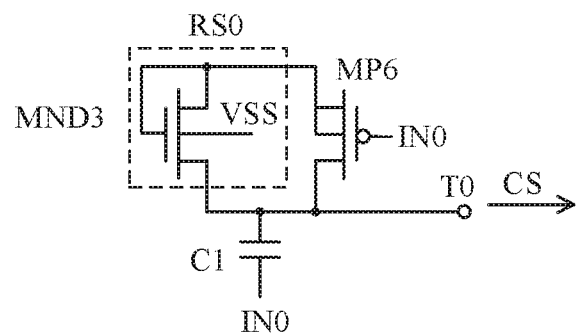

FIG. 4A to FIG. 4F illustrate some implementations of the RC network 340 shown in FIG. 3. Referring to FIG. 4A, the RC network 440A includes a resistor R1 and a capacitor C1, which are coupled in series between the reference signal RS0 and the input signal INO. The resistor R1 and the capacitor C1 can represent embodiments of the resistive circuit 342 and the capacitive circuit 344 shown in FIG. 3, respectively.

In the present embodiment, when the input signal INO stays at a first level, e.g. one of a logic low level and a logic high level, the signal level at the output terminal T0 is equal to, or substantially equal to, a signal level of the reference signal RS0. As a result, the signal level of the control signal CS is equal to, or substantially equal to, the signal level of the reference signal RS0. During a level transition of the input signal INO from the first level to a second level, e.g. the other of the logic low level and the logic high level, the capacitor C1 may adjust the signal level at the output terminal T0 to a signal level different from the signal level of the reference signal RS0. For example, during a level transition of the input signal INO from the logic low level to the logic high level, the signal level of the control signal CS can be adjusted to a signal level higher than the signal level of the reference signal RS0. As another example, during a level transition of the input signal INO from the logic high level to the logic low level, the signal level of the control signal CS can be adjusted to a signal level lower than the signal level of the reference signal RS0. In addition, after the input signal INO has transitioned to the second level, the signal level of the control signal CS may return to the signal level of the reference signal RS0.

Referring to FIG. 4B, the circuit structure of the RC network 440B is similar/identical to the circuit structure of the RC network 440A except that the RC network 440B includes a resistor R2. The resistor R2 is coupled between the reference signal RS0 and a reference signal RS1, which can be implemented using the supply voltage VSS shown in FIG. 2. The resistors R1 and R2 can represent an embodiment of the resistive circuit 342 shown in FIG. 3. The resistors R1 and R2 can serve as a voltage divider, which is configured to establish a divided voltage level at the output terminal T0 according to the reference signals RS0 and RS1.

In the present embodiment, when the input signal INO stays at a first level, e.g. one of a logic low level and a logic high level, the signal level at the output terminal T0 is equal to, or substantially equal to, the divided voltage level established by the resistors R1 and R2. As operation of the RC network 440B is similar/identical to operation of the RC network 440A, similar description is not repeated here for brevity.

Referring to FIG. 4C, the circuit structure of the RC network 440C is similar/identical to the circuit structure of the RC network 440B except that the RC network 440C utilizes diode connected p-channel transistors MPD1 and MPD2 as a voltage divider. As those skilled in the art can appreciate operation of the RC network 440C after reading above paragraphs directed to FIG. 4A and FIG. 4B, further description is omitted here for brevity.

Referring to FIG. 4D, the circuit structure of the RC network 440D is similar/identical to the circuit structure of the RC network 440B except that the RC network 440D utilizes diode connected n-channel transistors MND1 and MND2 as a voltage divider. A body of each of the diode connected n-channel transistors MND1 and MND2 is coupled to the supply voltage VSS shown in FIG. 2. As those skilled in the art can appreciate operation of the RC network 440D after reading above paragraphs directed to FIG. 4A and FIG. 4B, further description is omitted here for brevity.

Referring to FIG. 4E, the circuit structure of the RC network 440E is similar/identical to the circuit structure of the RC network 440A except that the RC network 440E includes a diode-connected n-channel transistor MND3 and a p-channel transistor MP6. The diode-connected n-channel transistor MND3 and the p-channel transistor MP6, connected in parallel between the reference signal RS0 and the output terminal T0, can represent an embodiment of the resistive circuit 342 shown in FIG. 3. A body of the diode connected n-channel transistor MND3 is coupled to the supply voltage VSS shown in FIG. 2. A control terminal of the p-channel transistor MP6 is coupled to the input signal INO.

In the present embodiment, during a level transition of the input signal INO from a logic low level to a logic high level, the capacitor C1 may adjust the signal level of the control signal CS to a signal level higher than the signal level of the reference signal RS0. Also, the p-channel transistor MP6 may provide a conduction path since the signal level at the output terminal T0 may be greater than a signal level at the control terminal of the p-channel transistor MP6. It is worth noting that as an on-resistance of the p-channel transistor MP6 is relatively small compared to that of a resistor, the signal level at the output terminal T0 shown in FIG. 4E increases faster than that shown in FIG. 4A. As a result, the RC network 440E can turn on a transistor coupled to the output terminal T0, such as the transistor MN2 or the transistor MN3 shown in FIG. 2, faster than the RC network 440A, thereby enhancing circuit performance and reducing power consumption. After the input signal INO has transitioned to the logic high level, the signal level of the control signal CS may return to a signal level substantially equal to the signal level of the reference signal RS0. As those skilled in the art can appreciate operation of the RC network 440E after reading above paragraphs directed to FIG. 4A, further description is omitted here for brevity.

Figure 4F:
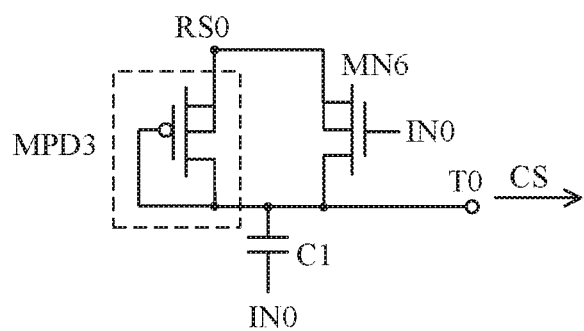

Referring to FIG. 4F, the circuit structure of the RC network 440F is similar/identical to the circuit structure of the RC network 440E except that the RC network 440F includes a diode-connected p-channel transistor MPD3 and an n-channel transistor MN6. The diode-connected n-channel transistor MPD3 and the n-channel transistor MN6, connected in parallel between the reference signal RS0 and the output terminal T0, can represent an embodiment of the resistive circuit 342 shown in FIG. 3. A control terminal of the p-channel transistor MP6 is coupled to the input signal INO. After reading above paragraphs directed to FIG. 4A and FIG. 4E, those skilled in the art can appreciate that the RC network 440F can turn on a transistor coupled to the output terminal T0, such as the transistor MP2 or the transistor MP3 shown in FIG. 2, faster than the RC network 440A. As a result, further description of the RC network 440F is omitted here for brevity.

It is worth noting that the circuit structures shown in FIG. 4A to FIG. 4F are provided for illustrative purposes, and are not intended to limit the scope of the present disclosure. Other RC networks implemented based on the circuit structure and operation described with reference to FIG. 3 are also within the contemplated scope of the present disclosure.

Referring back to FIG. 2, the level shifter 200 may further include a voltage generator 202, configured to receive the supply voltage VSP and generate the reference voltages VR1 and VR2 according a mode selection signal MS. For example, the reference voltage VR1 may have different voltage levels in response to different signal values of the mode selection signal MS. As another example, the reference voltage VR2 may have different voltage levels in response to different signal values of the mode selection signal MS. As a result, the level shifter 200 can support different voltage domains in response to different signal values of the mode selection signal MS.

To facilitate understanding of the proposed level shifter scheme, the following describes the operation of the level shifter 200 with reference to two modes of operation, referred to herein as a high voltage mode and a low voltage mode. In the high voltage mode, the reference voltages VR1 and VR2 has a same voltage level, and the supply voltage VSP has a voltage level equal to two times the voltage level of the reference voltage VR1/VR2. As the output signal OUT/OUTb, swing from the supply voltage VSP to the reference voltage VR1, can serve as a supply voltage for a next circuit stage coupled to the level shifter 200, each of the reference voltages VR1 and VR2 can be regarded as the supply voltage, and the supply voltage VSP can be regarded as two times the supply voltage. A lower boundary level of a signal range of the output signal OUT/OUTb may be equal to the voltage level of the reference voltage VR1/VR2. An upper boundary level of the signal range of the output signal OUT/OUTb may be equal to the voltage level of the supply voltage VSP. For example, the supply voltage VSP has a voltage level such as 3.3V. The voltage generator 202 is configured to receive the supply voltage VSP to generate the reference voltages VR1 and VR2, each of which has a voltage level such as 1.65V. Additionally, the input signal IN may have a signal range such as a voltage range from 0V to 1.65V.

In the low voltage mode, the supply voltage VSP and the reference voltage VR2 has a same voltage level, and the reference voltage VR1 has a voltage level the same as that of the supply voltage VSS such as a ground voltage. As a result, each of the supply voltage VSP and the reference voltage VR2 can be regarded as a supply voltage for a next circuit stage coupled to the level shifter 200. For example, the supply voltage VSP has a voltage level such as 1.8V. The voltage generator 202 is configured to receive the supply voltage VSP to generate the reference voltages VR1 and VR2, wherein the reference voltage VR1 has a voltage level such as 0V, and the reference voltage VR2 has a voltage level equal to the voltage level of the supply voltage VSP. Additionally, the input signal IN may have a signal range such as a voltage range from 0V to 1.8V. In some embodiments, in each of the high voltage mode and the low voltage mode, the input signal IN may have a same signal range, such as a voltage range from 0V to 1.65V or a voltage range from 0V to 1.8V.

Figure 5:
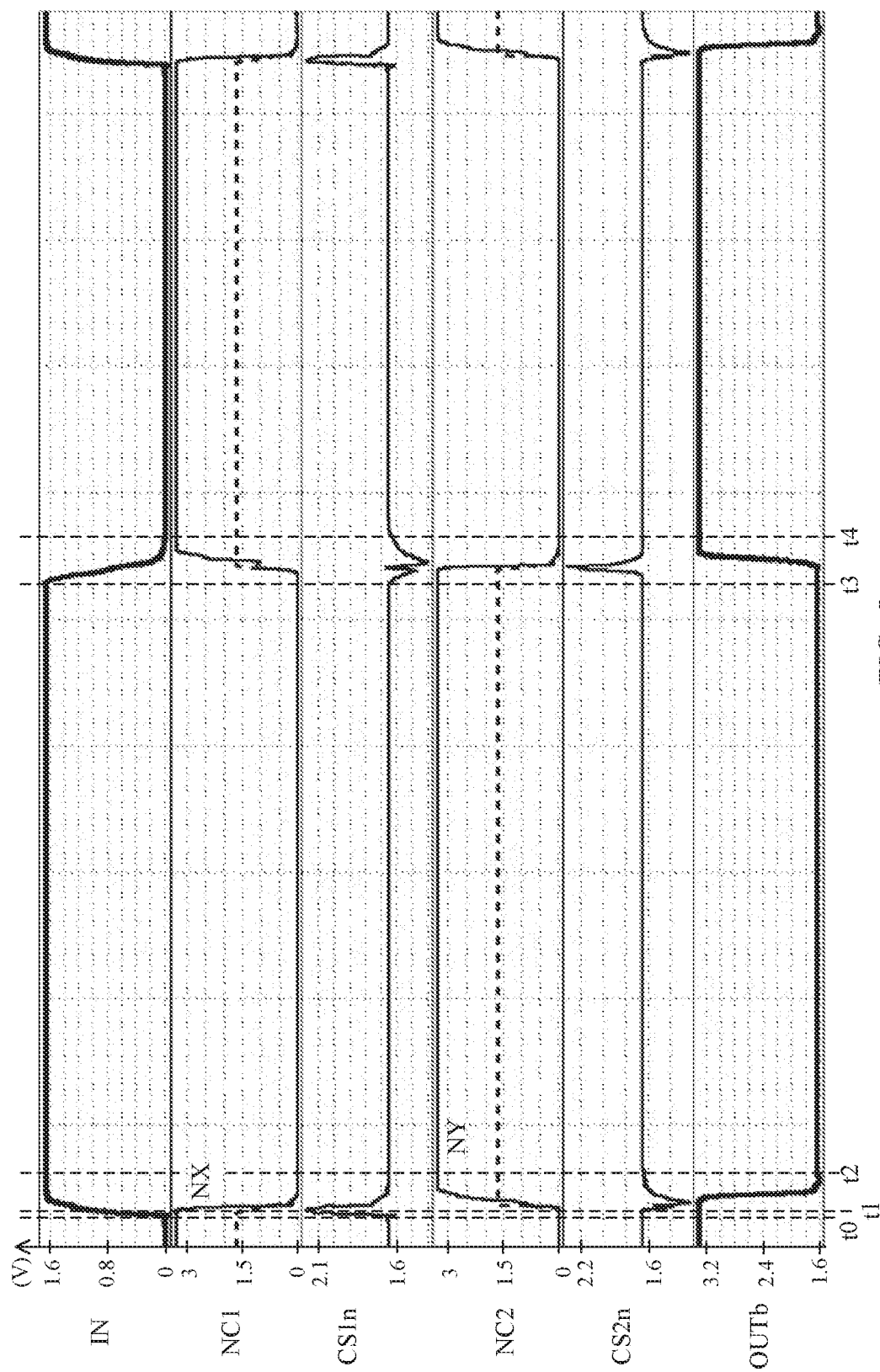
FIG. 5 illustrates signal waveforms associated with operation of the level shifter shown in FIG. 2 in a high voltage mode in accordance with some embodiments of the present disclosure.

FIG. 5 illustrates signal waveforms associated with operation of the level shifter 200 shown in FIG. 2 in a high voltage mode in accordance with some embodiments of the present disclosure. Referring to FIG. 5 and also to FIG. 2, prior to time t0, the input signal IN may stay at a logic low level, e.g. 0V. The input signal INb may stay at a logic high level, e.g. 1.65V. The output signal OUT stays at a logic low level, e.g. a voltage level of the reference voltage VR1 or 1.65V. The output signal OUTb stays at a logic high level, e.g. a voltage level of the supply voltage VSP or 3.3V. The transistors MP0 and MN1 are turned on, while the transistors MP1 and MN0 are turned off. The transistor MNX1 is turned off, while the transistor MNY1 is turned on.

In addition, the transistor MN4 is turned off, while the transistor MP4 is turned on. The signal level at the connection node NC1 is substantially equal to a voltage level of the reference voltage VR2, e.g. 1.65V. The RC network 242 is configured to maintain the signal level of the control signal CS1n at a reference signal level equal to the voltage level the reference voltage VR2. The transistor MN2 controlled by the control signal CS1n is turned off. The RC network 244 is configured to maintain the signal level of the control signal CS1p at a reference signal level equal to the voltage level the reference voltage VR1. The transistor MP2 controlled by the control signal CS1p is turned on. The signal level at the connection node NX, located between the two consecutive transistors MN2 and MP2, is substantially equal to the signal level of the output signal OUTb, e.g. 3.3V. The transistor MNX whose control terminal is coupled to the connection node NX is turned on.

Further, the transistor MN5 is turned on, while the transistor MP5 is turned off. The signal level at the connection node NC2 is substantially equal to a voltage level of the supply voltage VSS, e.g. 0V. The RC network 246 is configured to maintain the signal level of the control signal CS2n at a reference signal level equal to the voltage level the reference voltage VR2, e.g. 1.65V. The transistor MN3 controlled by the control signal CS2n is turned on. The RC network 248 is configured to maintain the signal level of the control signal CS2p at a reference signal level equal to the voltage level the reference voltage VR1, e.g. 1.65V. The transistor MP3 controlled by the control signal CS2p is turned off. The signal level at the connection node NY is substantially equal to the voltage level of the supply voltage VSS, e.g. 0V. The transistor MNY whose control terminal is coupled to the connection node NY is turned off.

At time t0, a low to high transition of the input signal IN begins. The RC network 242 can adjust the signal level of the control signal CS1n in response to the low to high transition of the input signal IN. The signal level of the control signal CS1n starts to rise.

At time t1, a difference between the signal level of the control signal CS1n and the signal level at the connection node NC1 reaches a threshold voltage value of the transistor MN2. The transistor MN2 is turned on accordingly. When the transistor MN2 is turned on, the signal level at the connection node NX may start to fall. It is worth noting that before the transistor MN2 is turned on, a drain-to-source voltage of the transistor MN2 is less than a sum of a signal swing of the output signal OUT and a threshold voltage of the transistor MN2. The signal swing of the output signal OUT may be equal to a voltage different between the supply voltage VSP and the reference voltage VR2. In other words, two connection terminals of the transistor MN2, e.g. a drain and a source, can be coupled to each other before a difference between respective signal levels at the two connection terminals, e.g. the drain-to-source voltage of the transistor MN2, exceeds a sum of the signal swing of the output signal OUT and the threshold voltage of the transistor MN2. In some embodiments, the drain-to-source voltage of the transistor MN2 may not exceed the signal swing of the output signal OUT before the transistor MN2 is turned on.

Consider a case where the control terminal of the transistor MN2 is connected to the reference voltage VR2 directly rather than the RC network 242. In such case, the transistor MN2 will be turned on when a source voltage of the transistor MN2 is reduced to the reference voltage VR2 minus a threshold voltage of the transistor MN2. However, as a drain voltage of the transistor MN2 has a voltage level equal to the voltage level of the supply voltage VSP before the transistor MN2 is turned on, a drain-to-source voltage of the transistor MN2 will reach a sum of the signal swing of the output signal OUT and the threshold voltage when the transistor MN2 is turned on. In other words, the drain-to-source voltage of the transistor MN2 will exceed the signal swing of the output signal OUT before the transistor MN2 is turned on, causing reliability problems.

In contrast, with the control circuit 240 or the RC network 242, the transistor MN2 can be turned on before the source voltage of the transistor MN2 is decreased to the reference voltage VR2 minus the threshold voltage, thereby reducing the overstress voltage (for example, the drain-to-source voltage of the transistor MN2) so as to extend reliability and useful life of the transistor MN2.

Additionally, the RC network 244 can decrease a signal level of the control signal CS1p in response to a high to low transition of the input signal INb, such that a difference between the signal level at the drive node ND1 and a signal level at the control terminal of the transistor MP2 can easily reach a threshold voltage value of the transistor MP2 to turn on the transistor MP2. The transistors MP2, MN2 and MN4 can form a discharging path to discharge the drive node ND1. After time t2, the input signal IN may stay at a logic high level, e.g. 1.65V.

In some embodiments, although the drive node ND1 may be slowly discharged because the transistor MP0 may stay turned on to charge the drive node ND1, the signal level at the connection node NX can be used to speed up the discharging of the drive node ND1, thereby alleviating fighting problems. For example, between time t0 and time t2, the signal level at the connection node NX falls earlier and faster than that of the output signal OUTb since the connection node NX is located between the connection node NC1 and the drive node ND1. As a result, the transistor MNX controlled by the signal level at the connection node NX can be turned off immediately after the transistor MN2 is turned on, thereby cutting off a discharging path of the inverter 212. When the transistor MNX is turned off, the transistor MP1 can charge the drive node ND2 rapidly, thus turning off the transistor MP0. When the transistor MP0 is turned off, the driver node ND1 can discharge rapidly such that the transistor MP1 can be completely turned on. The output signal OUT will transition to a logic high level, e.g. 3.3V. Further, the supply voltage VSP may charge the connection node NY through the transistor MP3, thereby turning on the transistor MNY to lock data stored in the drive nodes ND1 and ND2. It is worth noting that since the drive node ND1 may discharge rapidly, sizes of the transistors MP2 and MN2 can be reduced.

In some embodiments, when the connection node NY is charged by the supply voltage VSP in the high voltage mode, a drain-to-source voltage of the transistor MN3 may be greater than the signal swing of the output signal OUT, causing reliability problems. For example, the signal swing of the output signal OUT may also be equal to a difference between the supply voltage VSP and the reference voltage VR2 in the high voltage mode. Since a drain of the transistor MN3 is charged by the supply voltage VSP, the drain-to-source voltage of the transistor MN3 may be greater than the signal swing of the output signal OUT when a source voltage of the transistor MN3 drops below the reference voltage VR2. As the transistor MP5 can be turned on in response to a high to low transition of the input signal INb between time t0 and time t2, a source of the transistor MN3 may be charged to the voltage level of the reference voltage VR2, thus reducing the overstress voltage (for example, the drain-to-source voltage of the transistor MN3) so as to extend reliability and useful life of the transistor MN3. Similarly, when the drive node ND2 charged by the supply voltage VSP, the transistor MNX1 can maintain the intermediate node NI1 at the signal level of the reference voltage VR1, thus extending useful life of the transistor MN1. As a result, the transistors MP5 and MNX1 can be referred to as clampers.

In some embodiments, the RC network 246 can adjust a signal level of the control signal CS2n, thereby speeding up the charging of the connection node NY. For example, between time t0 and time t2, when the transistor MP5 is turned on in response to a high to low transition of the input signal INb, the connection node NC2 may be charged toward the voltage level of the reference voltage VR2. In addition, the RC network 246 can decrease the signal level of the control signal CS2n to be lower than the voltage level of the reference voltage VR2 in response to the high to low transition of the input signal INb, thereby turning on the transistor MN3. As a result, the reference voltage VR2 can charge the connection node NY immediately after the transistors MP5 and MN3 are turned on.

Between time t2 and time t3, as the input signal IN stays at a logic high level, the RC network 242 is configured to maintain the control signal CS1n at the voltage level the reference voltage VR2. The RC network 244 is configured to maintain the control signal CS1p at the voltage level the reference voltage VR1.

Between time t3 and time t4, a high to low transition occurs in the input signal IN, resulting in a low to high transition of the input signal INb. The RC network 246 can adjust the signal level of the control signal CS2n in response to the low to high transition of the input signal INb. The RC network 248 can adjust the signal level of the control signal CS2p in response to the high to low transition of the input signal IN. As those skilled in the art can appreciate that operation of the level shifter 200 during the low to high transition of the input signal INb is similar/identical to that during the low to high transition of the input signal IN, further description associated with the low to high transition of the input signal INb is omitted here for brevity.

Operation of the level shifter 200 in the low voltage mode is similar/identical to operation of the level shifter 200 in the high voltage mode except that the voltage generator 202 may change respective voltage levels of the supply voltage VSP, the reference voltage VR1 and the reference voltage VR2. As those skilled in the art can appreciate the operation of the level shifter 200 in the low voltage mode after reading the above paragraphs directed to FIG. 2 through FIG. 5, similar description is omitted here for brevity.

With the use of the proposed level shifting scheme, the level shifter 200 can extend reliability of circuit elements therewithin in the high voltage mode by turning on a circuit path in response to a level transition of the input signal IN/INb. Additionally or alternatively, the level shifter 200 can alleviate fighting problems by actively cutting off a discharging path according to a signal level at a connection node, wherein the signal level at the connection node changes rapidly in response to a level transition of the input signal IN/INb.

It is worth noting that the circuit structure shown in FIG. 2 is provided for illustrative purposes, and is not intended to limit the scope of the present disclosure. In some embodiments, the driver circuit 232 may include two or more transistors coupled in series on a circuit path between the drive node ND1 and the connection node NC1. The connection node NX, coupled to the control terminal of the transistor MNX, can be located between two consecutive transistors of the transistors. The two consecutive transistors may be, but are not limited to, a p-channel transistor and an n-channel transistor coupled in series. In some cases where a current signal flows from the drive node ND1 to the connection node NC1 when the circuit path is turned on, the p-channel transistor may be disposed between the connection node NX and the drive node ND1, and the n-channel transistor may be disposed between the connection node NX and the connection node NC1. In some cases where a current signal flows from the connection node NC1 to the drive node ND1 when the circuit path is turned on, the p-channel transistor may be disposed between the connection node NX and the connection node NC1, and the n-channel transistor may be disposed between the connection node NX and the drive node ND1. Similarly, in some embodiments, the driver circuit 234 may include two or more transistors coupled in series on a circuit path between the drive node ND2 and the connection node NC2.

Figure 6:
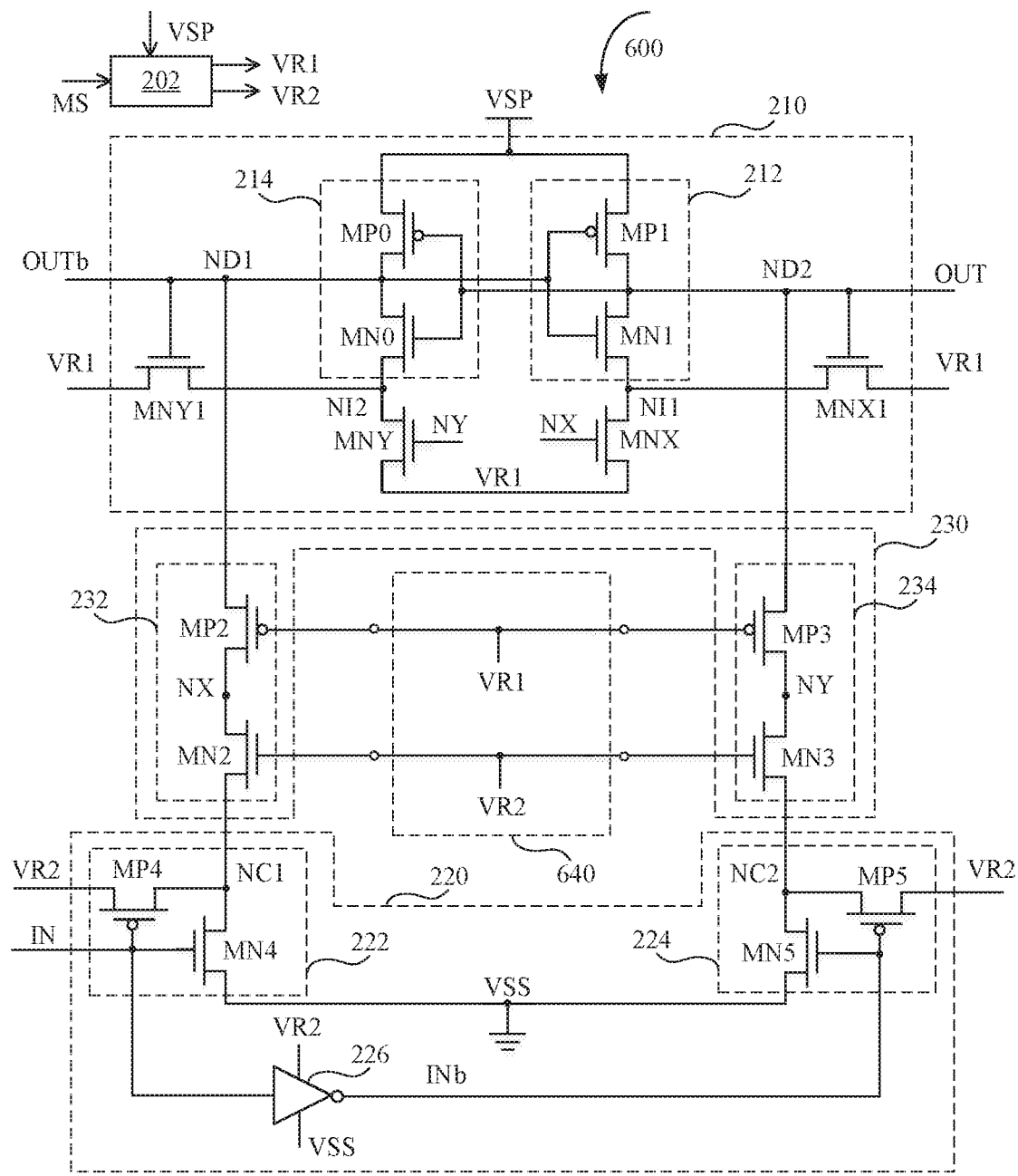
FIG. 6 illustrates another implementation of the level shifter shown in FIG. 1 in accordance with some embodiments of the present disclosure.
Figure 7:
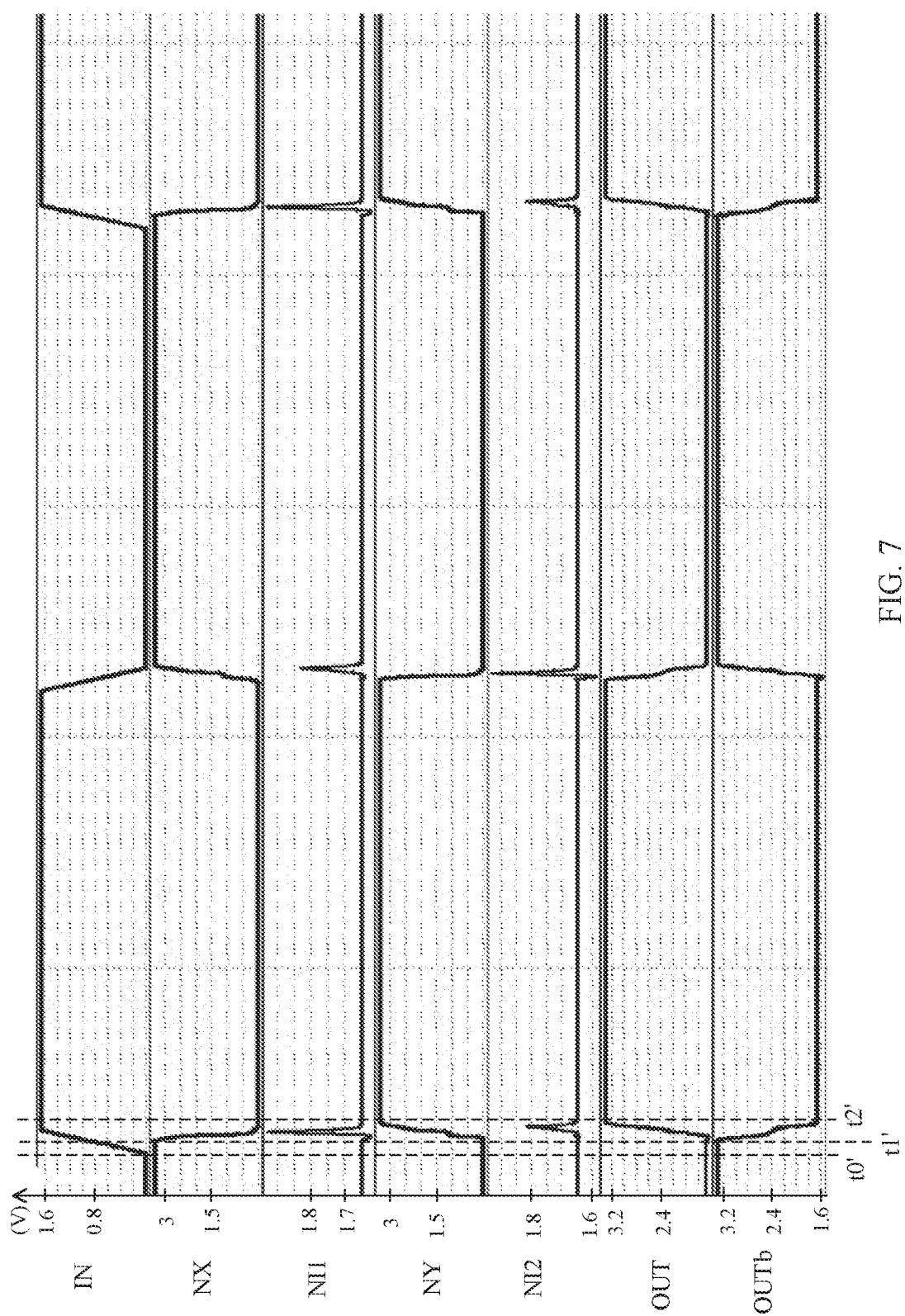
FIG. 7 illustrates signal waveforms associated with operation of the level shifter shown in FIG. 6 in a high voltage mode in accordance with some embodiments of the present disclosure.

FIG. 6 illustrates another implementation of the level shifter 100 shown in FIG. 1 in accordance with some embodiments of the present disclosure. The circuit structure of the level shifter 600 is similar/identical to that of the level shifter 200 shown in FIG. 2 except that the control circuit 640 can directly couple the respective control terminals of the transistors MP2 and MP3 to the reference voltage VR1, and directly couple the respective control terminals of the transistors MN2 and MN3 to the reference voltage VR2. For illustrative purposes, exemplary signal waveforms associated with operation of the level shifter 600 shown in FIG. 6 in a high voltage mode are illustrated in FIG. 7 in accordance with some embodiments of the present disclosure. In the present embodiment, respective voltage levels of the supply voltage VSP, the reference voltage VR1 and the reference voltage VR2 in the high voltage mode may be equal to 3.3V, 1.65V and 1.65V, respectively.

Referring to FIG. 7 and also to FIG. 6, prior to time t0', the input signal IN may stay at a logic low level, e.g. 0V. The input signal INb may stay at a logic high level, e.g. 1.65V. The output signal OUT stays at a logic low level, e.g. a voltage level of the reference voltage VR1. The output signal OUTb stays at a logic high level, e.g. a voltage level of the supply voltage VSP. As a result, the transistors MP0 and MN1 are turned on, while the transistors MP1 and MN0 are turned off. The transistor MNX1 is turned off, while the transistor MNY1 is turned on.

In addition, as the input signal IN may stay at a logic low level, the transistor MN4 is turned off, and the transistor MP4 is turned on. The signal level at the connection node NC1 is substantially equal to a voltage level of the reference voltage VR2. Accordingly, the transistor MN2 whose control terminal is coupled to the reference voltage VR2 is turned off. As the output signal OUTb may stay at a logic high level, the transistor MP2 whose control terminal is coupled to the reference voltage VR1 is turned on. The signal level at the connection node NX is substantially equal to the signal level of the output signal OUTb such that the transistor MNX is turned on.

Further, as the input signal INb may stay at a logic high level, the transistor MN5 is turned on, and the transistor MP5 is turned off. The signal level at the connection node NC2 is substantially equal to a voltage level of the supply voltage VSS. Accordingly, the transistor MN3 whose control terminal is coupled to the reference voltage VR2 is turned on. The signal level at the connection node NY is substantially equal to the voltage level of the supply voltage VSS such that the transistor MNY is turned off. Moreover, as the output signal OUT may stay at a logic low level, the transistor MP3 whose control terminal is coupled to the reference voltage VR1 is turned off.

At time t0', a low to high transition of the input signal IN begins. At time t1', the signal level at the connection node NC1 is decreased to be less than or equal to a voltage level of the reference voltage VR2 minus a threshold voltage of the transistor MN2. The transistor MN2 is turned on accordingly, and the connection node NX starts to discharge. Also, a signal level of the output signal OUTb can start to fall. At time t2', a signal level of the output signal OUT can be transitioned to a logic high level.

It is worth noting that when discharged through the transistors MP2, MN2 and MN4, the drive node ND1 may be charged through the transistor MP0 which may stay turned on, causing fighting problems. With the use of the transistor MNX whose control terminal is coupled to the connection node NX, the discharging of the drive node ND1 can be speeded up, thereby alleviating fighting problems.

For example, between time t1' and time t2', the signal level at the connection node NX falls earlier and faster than that of the output signal OUTb since the connection node NX is located between the connection node NC1 and the drive node ND1. As a result, the transistor MNX controlled by the signal level at the connection node NX can be turned off immediately after the transistor MN2 is turned on, thereby cutting off a discharging path of the inverter 212. When the transistor MNX is turned off, the transistor MP1 can charge the drive node ND2 rapidly, thus turning off the transistor MP0. When the transistor MP0 is turned off, the driver node ND1 can discharge rapidly such that the transistor MP1 can be completely turned on. The output signal OUT will transition to a logic high level, e.g. 3.3V. Further, the supply voltage VSP may charge the connection node NY through the transistor MP3, thereby turning on the transistor MNY to lock data stored in the drive nodes ND1 and ND2. It is worth noting that since the drive node ND1 may discharge rapidly, sizes of the transistors MP2 and MN2 can be reduced.

In some embodiments, when the connection node NY is charged by the supply voltage VSP in the high voltage mode, a drain-to-source voltage of the transistor MN3 may be greater than a signal swing of the output signal OUT, causing reliability problems. The transistor MP5, also referred to as a clamper, can be used to charge a source of the transistor MN3 to extend useful life of the transistor MN3. Similarly, transistor MNX1, also referred to as a clamper, can be used to maintain the intermediate node NI1 at the signal level of the reference voltage VR1 to thereby extend useful life of the transistor MN1.

As those skilled in the art can appreciate operation of the level shifter 600 after reading the above paragraphs directed to FIG. 1 through FIG. 5, further description is omitted here for brevity.

Figure 8:
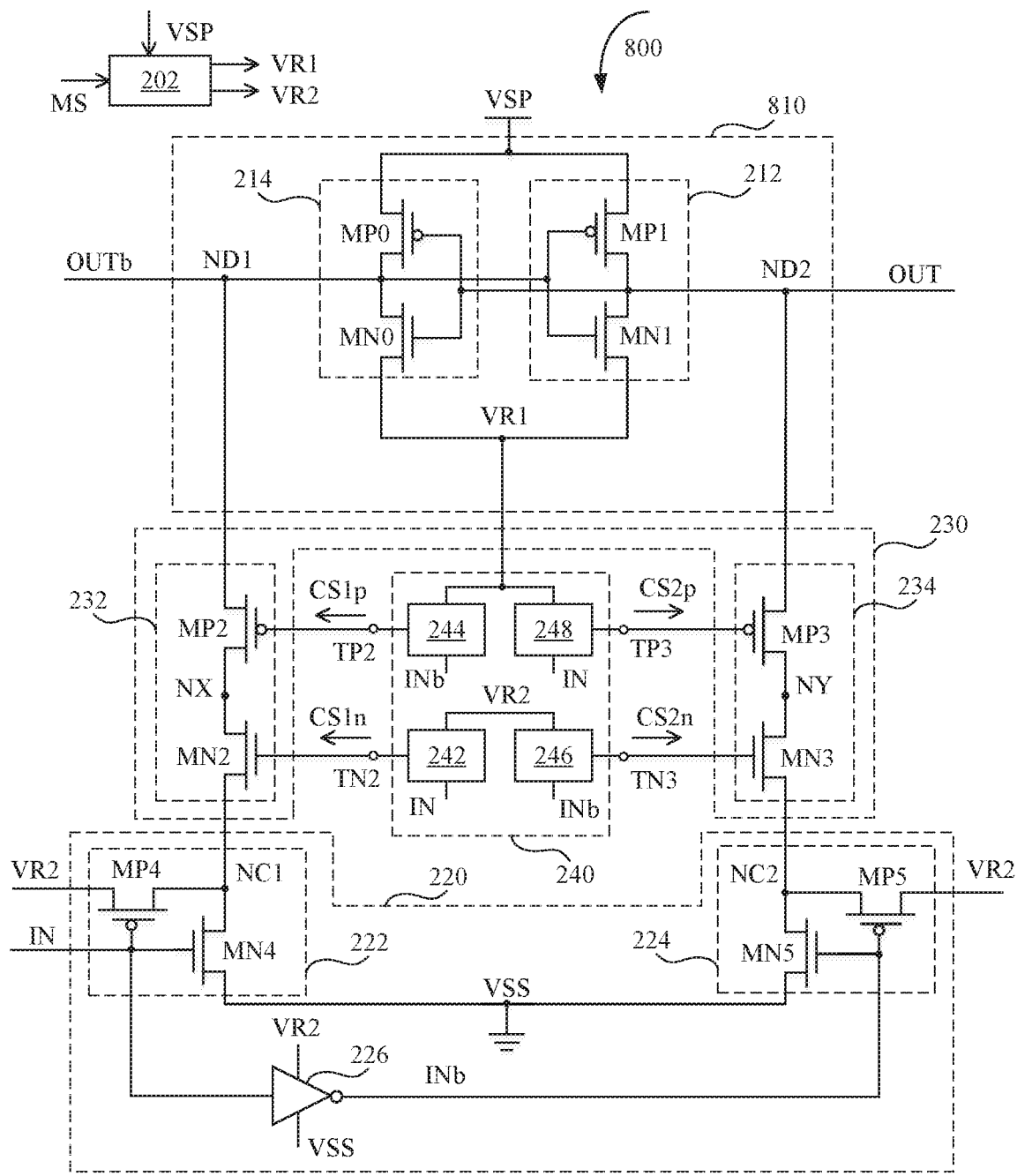
FIG. 8 illustrates another implementation of the level shifter shown in FIG. 1 in accordance with some embodiments of the present disclosure.

FIG. 8 illustrates another implementation of the level shifter 100 shown in FIG. 1 in accordance with some embodiments of the present disclosure. The circuit structure of the level shifter 800 is similar/identical to that of the level shifter 200 shown in FIG. 2 except that the latch circuit 810. In the present embodiment, the latch circuit 810 may include the inverters 212 and 214 shown in FIG. 2, wherein each of the inverters 212 and 214 is coupled between the supply voltage VSP and the reference voltage VR1. After reading the above paragraphs directed to FIG. 1 through FIG. 5, those skilled in the art can appreciate that the level shifter 800 can utilize the control circuit 240 to reduce voltage stresses applied to the driver stage 230. As a result, further description is omitted here for brevity.

With the use of the proposed level shifting scheme, a level shifter can extend reliability of circuit elements therewithin by turning on a circuit path in response to a level transition of an input signal. Additionally or alternatively, the level shifter can alleviate fighting problems by actively cutting off a discharging path according to a signal level at a connection node, wherein the signal level at the connection node changes rapidly in response to a level transition of the input signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A level shifter, comprising:
   a latch circuit, configured to generate an output signal according to a signal level at a first drive node and a signal level at a second drive node;
   an input stage, configured to receive an input signal to adjust a signal level at a connection node;
   a driver stage, configured to drive the first drive node by coupling the connection node to the first drive node according to a set of control signals, wherein the driver stage comprises a first transistor coupled between the connection node and the first drive node; a control terminal of the first transistor is arranged to receive a control signal in the set of control signals; and
   a control circuit, coupled to the input stage and the driver stage, the control circuit configured to control the driver stage to couple the connection node to the first drive node by adjusting a signal level of each control signal in the set of control signals during a level transition of the input signal, wherein the control circuit comprises:
   a resistive-capacitive (RC) network coupled to the control terminal of the first transistor, the RC network configured to generate the control signal received by the control terminal, and adjust a signal level of the control signal received by the control terminal in response to the level transition of the input signal.

2. The level shifter of claim 1, wherein the connection node is coupled to the first drive node before a difference between the respective signal levels at the first drive node and the connection node exceeds a signal swing of the output signal.

3. The level shifter of claim 1, wherein after the level transition of the input signal, the control circuit is configured to maintain each control signal in the set of control signals at a reference signal level.

4. The level shifter of claim 3, wherein the reference signal level is equal to a boundary level of a signal range of the output signal.

5. The level shifter of claim 1, wherein the RC network comprises a resistive circuit and a capacitor, the resistive circuit is coupled between the control terminal and a first reference signal, and the capacitor is coupled between the control terminal and one of the input signal and an inverted signal of the input signal; the resistive circuit comprises one of a first circuit arrangement, a second circuit arrangement and a third circuit arrangement; the first circuit arrangement comprises:
 a first resistive element coupled between the control terminal and the first reference signal;
 the second circuit arrangement comprises:
 a second resistive element coupled between the control terminal and the first reference signal; and
 a third resistive element coupled between the control terminal and a second reference signal different from the first reference signal; and
 the third circuit arrangement comprises:
 a diode-connected transistor and a second transistor connected in parallel between the control terminal and the first reference signal, a control terminal of the second transistor being coupled to the one of the input signal and the inverted signal of the input signal.

6. The level shifter of claim 1, wherein a first connection terminal of the first transistor is coupled to the first drive node, and a second connection terminal of the first transistor is coupled to the connection node; before a difference between respective signal levels at the first connection terminal and the second connection terminal exceeds a sum of a signal swing of the output signal and a threshold voltage of the first transistor, the control circuit is configured to turn on the first transistor to couple the second connection terminal to the first connection terminal.

7. The level shifter of claim 1, wherein the RC network comprises an output terminal, a resistive circuit and a capacitive circuit, wherein the output terminal is coupled to the control terminal of the first transistor and arranged to output the control signal in the set of control signals, the resistive circuit is coupled between the output terminal and a reference signal, and the capacitive circuit is coupled between the output terminal and one of the input signal and an inverted signal of the input signal.

8. The level shifter of claim 7, wherein the resistive circuit is configured to apply a reference signal level to the output terminal according to the reference signal; the capacitive circuit is configured to, in response to the level transition of the input signal, adjust a signal level at the output terminal to adjust the signal level of the control signal.

9. The level shifter of claim 8, wherein the reference signal level is equal to a boundary level of a signal range of the output signal.

10. The level shifter of claim 7, wherein the capacitive circuit is configured to receive the one of the input signal and the inverted signal, and adjust the signal level of the control signal by adjusting a signal level at the output terminal in response to the level transition of the input signal.

11. The level shifter of claim 1, wherein the latch circuit is coupled between a supply voltage and a reference voltage, and the latch circuit comprises:
 a first inverter and a second inverter cross-coupled between the first drive node and the second drive node, the first inverter being coupled between the supply voltage and an intermediate node, the first inverter being configured to generate the output signal; and
 a second transistor coupled between the intermediate node and the reference voltage, wherein a control terminal of the second transistor is coupled to another connection node located on a circuit path between the first drive node and the connection node.

12. The level shifter of claim 11, wherein the driver stage comprises a plurality of transistors coupled in series on the circuit path, the first transistor is one of the transistors, and the another connection node is located between two consecutive transistors of the transistors.

13. The level shifter of claim 12, wherein one of the two consecutive transistors is a p-channel transistor, and the other of the two consecutive transistors is an n-channel transistor; a current signal flows from one of the first drive node and the connection node to the other of the first drive node and the connection node when the circuit path is turned on; the p-channel transistor is disposed between the another connection node and the one of the first drive node and the connection node, and the n-channel transistor is disposed between the another connection node and the other of the first drive node and the connection node.

14. The level shifter of claim 11, wherein the latch circuit further comprises:
 a third transistor coupled between the reference voltage and the intermediate node, wherein a control terminal of the third transistor is coupled to the second drive node.

15. A level shifter, comprising:
 an input stage configured to receive an input signal to adjust a signal level at a first connection node and a signal level at a second connection node;
 a driver stage coupled to the first connection node and the second connection node, wherein the driver circuit is configured to couple the first connection node to a first drive node to drive the first drive node, and is configured to couple the second connection node to a second drive node to drive the second drive node; and
 a latch circuit coupled between a supply voltage and a reference voltage, the latch circuit comprising:
 a first inverter and a second inverter cross-coupled between the first drive node and the second drive node, the first inverter being coupled between the supply voltage and a first intermediate node, the second inverter being coupled between the supply voltage and a second intermediate node, the first inverter being configured to generate an output signal according to a signal level at the first drive node and a signal level at the second drive node;
 a first transistor coupled between the first intermediate node and the reference voltage, wherein a control terminal of the first transistor is coupled to a third connection node located on a first circuit path between the first drive node and the first connection node; and
 a second transistor coupled between the second intermediate node and the reference voltage, wherein a control terminal of the second transistor is coupled to a fourth connection node located on a second circuit path between the second drive node and the second connection node.

16. The level shifter of claim 15, wherein the driver stage comprises a plurality of transistors coupled in series on the first circuit path, and the third connection node is located between two consecutive transistors of the transistors.

17. The level shifter of claim 16, wherein one of the two consecutive transistors is a p-channel transistor, and the other of the two consecutive transistors is an n-channel transistor; a current signal flows from one of the first drive node and the first connection node to the other of the first drive node and the first connection node when the first circuit path is turned on; the p-channel transistor is disposed between the third connection node and the one of the first drive node and the first connection node, and the n-channel transistor is disposed between the third connection node and the other of the first drive node and the first connection node.

18. The level shifter of claim 13, wherein the latch circuit further comprises:
 a third transistor coupled between the reference voltage and the first intermediate node, wherein a control terminal of the third transistor is coupled to the second drive node; and
 a fourth transistor coupled between the reference voltage and the second intermediate node, wherein a control terminal of the fourth transistor is coupled to the first drive node.

19. A level shifter, comprising:
 a first inverter and a second inverter cross-coupled between a first drive node and a second drive node, the first inverter being configured to generate a first output signal, the second inverter being configured to generate a second output signal complementary to the first output signal;
 a first input circuit configured to receive an input signal to adjust a signal level at a first connection node;
 a second input circuit configured to receive an inverted signal of the input signal to adjust a signal level at a second connection node;
 a first driver circuit, configured to drive the first drive node by coupling the first connection node to the first drive node according to a first control signal;
 a second driver circuit, configured to drive the second drive node by coupling the second connection node to the second drive node according to a second control signal;
 a first resistive-capacitive (RC) network, comprising a first output terminal, a first resistive circuit and a first capacitive circuit, wherein the first output terminal is arranged to output the first control signal, the first resistive circuit is coupled between the first output terminal and a reference signal, and the first capacitive circuit is coupled between the first output terminal and one of the input signal and the inverted signal; and
 a second RC network, comprising a second output terminal, a second resistive circuit and a second capacitive circuit, wherein the second output terminal is arranged to output the second control signal, the second resistive circuit is coupled between the second output terminal and the reference signal, and the second capacitive circuit is coupled between the second output terminal and the other of the input signal and the inverted signal.

20. The level shifter of claim 19, wherein the first resistive circuit comprises one of a first circuit arrangement, a second circuit arrangement and a third circuit arrangement; the first circuit arrangement comprises:
 a first resistive element coupled between the first output terminal and the reference signal;
the second circuit arrangement comprises:
 a second resistive element coupled between the first output terminal and the reference signal; and
 a third resistive element coupled between the first output terminal and another reference signal different from the reference signal; and
the third circuit arrangement comprises:
 a diode-connected transistor and a transistor connected in parallel between the first output terminal and the reference signal, a control terminal of the transistor being coupled to the one of the input signal and the inverted signal.

* * * * *